United States Patent
Yoshida et al.

(10) Patent No.: US 6,570,801 B2
(45) Date of Patent: May 27, 2003

(54) SEMICONDUCTOR MEMORY HAVING REFRESH FUNCTION

(75) Inventors: Munehiro Yoshida, Yokohama (JP); Hiroshi Shinya, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/981,517

(22) Filed: Oct. 16, 2001

(65) Prior Publication Data

US 2002/0074568 A1 Jun. 20, 2002

(30) Foreign Application Priority Data

Oct. 27, 2000 (JP) ........................................ 2000-329264

(51) Int. Cl.[7] ................................................ G11C 7/00
(52) U.S. Cl. ............. 365/222; 365/230.03; 365/230.06; 365/226
(58) Field of Search ............................ 365/222, 230.03, 365/226, 230.06

(56) References Cited

U.S. PATENT DOCUMENTS

| 5,089,987 A | | 2/1992 | Nakao et al. | |
|---|---|---|---|---|
| 5,331,601 A | | 7/1994 | Parris | |
| 5,629,898 A | * | 5/1997 | Idei et al. | 365/195 |
| 5,798,976 A | * | 8/1998 | Arimoto | 365/222 |
| 5,822,264 A | * | 10/1998 | Tomishima et al. | 365/189.09 |
| 5,867,439 A | * | 2/1999 | Asakura et al. | 365/200 |

* cited by examiner

Primary Examiner—Michael S. Lebentritt
Assistant Examiner—Toan Le
(74) Attorney, Agent, or Firm—Hogan & Hartson, LLP (57) ABSTRACT

An internal row address signal is generated by a refresh address counter and supplied to a row decoder. In a normal refresh operation, the refresh address counter sequentially increments the internal row address signal on the basis of a trigger signal. As a result, the data in all memory cells is refreshed. In a low-consumption-current refresh operation, at least one of the bits of the internal row address signal is fixed. Hence, the refresh operation is executed only for the memory cells of a predetermined refresh area.

28 Claims, 6 Drawing Sheets

FIG. 11   NOTE: RACCx="H", bRACCx="L"

SEMICONDUCTOR MEMORY HAVING REFRESH FUNCTION

CROSS-REFERENCE TO RELATED APPLICATIONS

This application is based upon and claims the benefit of priority from the prior Japanese Patent application No. 2000-329264, filed Oct. 27, 2000, the entire contents of which are incorporated herein by reference.

BACKGROUND

The present invention relates to a dynamic random access memory (hereinafter referred to as a DRAM) capable of retaining data with low power consumption.

To retain data for a long time, the DRAM has to execute a refresh operation. This operation is necessary for the DRAM, due to the inherent characteristic of the memory cells of the DRAM. In general, the refresh operation of a DRAM includes two kinds of operations: one is a refresh operation executed in response to a trigger signal supplied from outside a chip (i.e., an auto refresh operation); and the other is a refresh operation executed in response to a trigger signal generated inside the chip (i.e., a. self refresh operation).

Let us consider the case of a 64-Mbit synchronous DRAM by way of example. In this type of DRAM, a trigger signal (an auto refresh command) has to be supplied into a chip 4,096 times during a period of 64 ms, and a refresh operation has to be executed for all memory cells of the 64-Mbit DRAM during that period.

In other words, the longest refresh interval, i.e., the interval between the time when one memory cell is refreshed and the time when the same memory cell is refreshed again, is 64 ms.

Hence, the characteristic of reliably retaining data at least during this 64 ms period (i.e., a so-called "pause time characteristic") is essential to each memory cell.

Normally, a refresh operation is executed in units of one row, and the one-time refresh operation enables the data in the memory cells of one row to be refreshed by means of a sense amplifier. If the memory capacity of a memory cell ray is n bits (a: being a constant), the number of memory cells refreshed in the one-time refresh operation is in bits (in: being a constant), and the refresh interval is tR seconds, ten the number N of times the refresh operation is executed per unit time is expressed by:

$$N = n/(m \cdot tR) \quad (1)$$

Let us assume that each memory cell consumes the same amount of current for the refresh operation and that the current consumption m is constant throughout the refresh operation (m: a constant). In this case, the total amount of current consumed in the refresh operation can be reduced by lengthening the refresh interval tR and reducing the number of times the refresh operation is executed per unit time.

For example, in the cell refresh operation, an arbitrary refresh interval tR can be freely selected within a chip. It should be also noted that when a DRAM having a self-refresh function is being used, the amount of current consumed for the self-refresh operation must be as small as possible. In this type of DRAM, therefore, the refresh interval tR is controlled to be the longest value within the range which the characteristics (the pause time characteristic) of the memory cells allow.

More specifically, if the pause time characteristic of the memory cells is 64 ms, the refresh interval tR at the time of the self refresh operation is set at 64 ms, which is a maximal value within the setting range. Likewise, if the pause time characteristic of the memory cells is 128 ms, the refresh interval tR at the time of the self refresh operation is set at 128 ms.

Where the pause time characteristic of the memory cells is 128 ms, the number N of times the refresh operation is executed per unit time can be reduced by one half in comparison with the case where the pause time characteristic is 64 ms. As a result, the amount of current consumed for the refresh operation can be reduced by one half.

The number N of times the refresh operation is executed per unit time can be given by formula (1) set forth above. As one way to reduce the total amount of current consumed in the refresh operation, it is thought to lengthen the refresh interval tR to a maximal value within the range the pause time characteristic allows, and to reduce the number N of times the refresh operation is executed per unit time.

However, the refresh interval tR depends on the pause time characteristics of memory cells. It follows from this that the pause time characteristic of the memory cells has to be improved in order to ensure a long refresh interval tR. In terms of the device structure, however, it is very difficult to improve the pause time characteristic of the memory cells to such an extent as to significantly reduce the amount of current consumed for the refresh operation.

SUMMARY

A semiconductor memory according to an aspect of the present invention comprises: a memory cell array; a signal generation circuit which generates an internal address signal used for selecting rows of the memory cell array at the time of a refresh operation; and a control circuit which fixes the value of at least one of the bits of the internal address signal on the basis of a first control signal and selects the rows in a refresh area whose memory capacity is smaller than that of the memory cell array, at the time of the refresh operation.

Another semiconductor memory according to an aspect of the present invention comprises: a memory cell array; a signal generation circuit which generates an internal address signal used for selecting rows of the memory cell array at the time of a refresh operation; a control circuit which selects rows in a refresh area whose memory capacity is smaller than that of the memory cell array on the basis of a first control signal at the time of the refresh operation; and a refresh timer which determines refresh execution timings, wherein, when the rows in the refresh area are selected, the refresh timer switches the refresh execution timings and changes timings for selecting the rows in the refresh area.

DETAILED DESCRIPTION

A semiconductor memory according to an example of the present invention will now be described in detail with reference to the accompanying drawings.

[Outline]

The semiconductor memory of the example will be outlined first of all.

The number N of times the refresh operation is executed per unit time is given by formula (1) set forth above. In formula (1), the memory capacity n of the memory cell array and the number m of memory cells refreshed per refresh operation are both fixed values (that is, the memory capacity of the DRAM and the amount of current consumed in the one-time refresh operation are both constant). Therefore, lengthening the refresh interval tR is the only way to reduce the number N of times the refresh operation is executed per unit time.

As described above, however, the refresh interval tR is dependent on the pause time characteristic of the memory cells and is very difficult to lengthen.

Under the circumstances, attention was paid to the memory capacity n of the memory cell array. If the memory capacity n of the memory cells is reduced, the number N of times the refresh operation is executed per unit time can be significantly reduced. Hence, the amount of current consumed for the refresh operation can be reduced with no need to improve the pause time characteristic of the memory cells.

At the same time, however, the reduction of the memory capacity n of the memory cell array undesirably entails a decrease in the amount of data that can be stored in the memory cell array.

To solve this problem, the memory cell array is divided into a plurality of areas without changing the memory capacity n of the memory cell array. The area which is subjected to the refresh operation is selected from among the divided areas of the memory cell array. That is, at least one of the areas of the memory cell array is selected, and the refresh operation is executed only for the selected area. By executing the refresh operation in this manner, it is possible to obtain the same advantage as that of the case where the memory capacity n is reduced in formula (1). As a result, the total amount of current consumed in the refresh operation can be reduced.

To put it plainly, formula (1) set forth above can be rewritten as follows:

$$N = nrefresh/(m \cdot tR) \quad (2)$$

where "nrefresh" means the memory capacity which an area (refresh area) subjected to the refresh operation has and which is part of the total memory capacity n of the memory cell array.

A semiconductor memory according to the example of the present invention is suitable for use as an electronic device (e.g., a cellular phone or another kind of portable electronic device) which must store a large amount of data and, in a special case, must store a small amount of data with low power consumption.

In a normal case, the semiconductor memory according to the example provides a large memory capacity (e.g., a total memory capacity n) and used for storing a large amount of data. In a special case, the semiconductor memory provides a small memory capacity (e.g., a memory capacity of at least one of a plurality of areas of the memory cell array) and used for storing a small amount of data.

When a large amount of data is stored, the total memory capacity n of the memory cell array is used. In this case, the refresh area is the same as the entire memory cell array (nrefresh=n), and formula (1) set forth above is applicable. On the other hand, where a small amount of data is stored, the memory capacity n1 (<n) of at least one of a plurality of areas of the memory cell array) is used. In this case, the refresh area is part of the memory cell array (refresh=n1), and the amount of current consumed can be reduced, accordingly.

[Overview]

Figure 1:
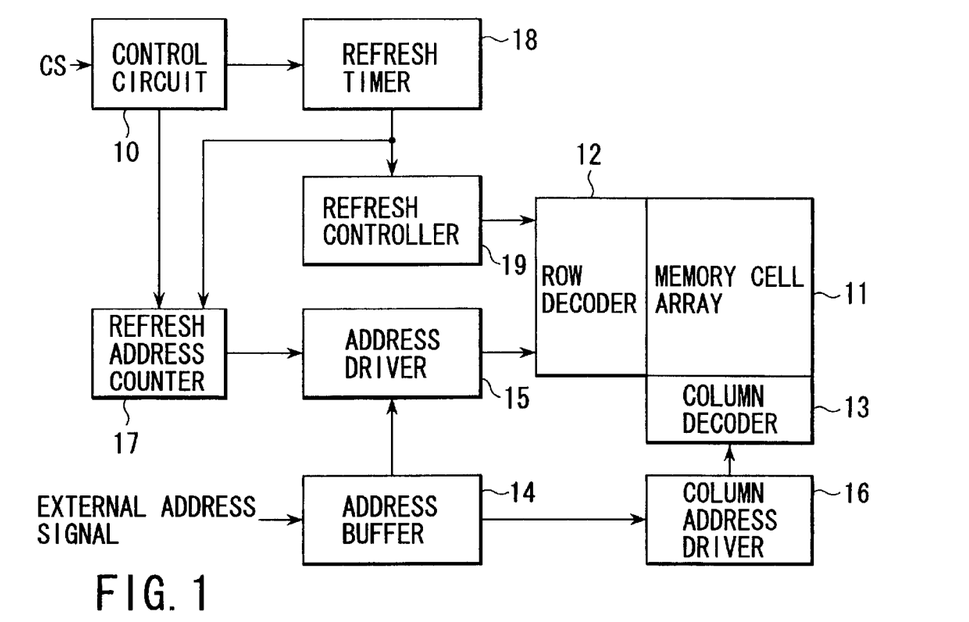
FIG. 1 shows the major portion of a semiconductor memory according to one example of the present invention.

FIG. 1 shows the major portion of a semiconductor memory according to one example of the present invention.

Referring to FIG. 1, a row decoder 12 selects a row (word line) of a memory cell array 11 on the basis of either an external row address signal or an internal row address signal (a refresh address signal). A column decoder 13 selects a column of the memory cell array 11 on the basis of the external column address signal.

The external row address signal is supplied to the row decoder 12 through an address buffer 14 and a row address driver 15. On the other hand, the external column address signal is supplied to the column decoder 13 through the address buffer 14 and a column address driver 16.

The internal row address signal (a refresh address signal) is generated by a refresh address counter 17. It is supplied to the row decoder 12 through the row address driver 15. The row address driver 15 has a function of providing a potential for the row (or word line) that is selected in accordance with the external row address signal or the internal row address signal.

A refresh timer 18 determines refresh intervals. A refresh controller 19 controls a series of refresh operations so that the data in each memory cell can be refreshed at the refresh intervals.

A control signal CS is used for switching between a normal refresh operation and a refresh operation according to the present invention. (The normal refresh operation refreshes all memory cells of a memory cell array 11, while the refresh operation according to the present invention refreshes some of the memory cells of the memory cell array 11 and does not require a large amount of current.) The control signal CS is supplied, for example, from outside of a chip.

The control signal CS is supplied to a control circuit 10. In response to the control signal CS, the control circuit 10 outputs signals based on which either a normal refresh operation or a refresh operation according to the present invention (i.e., a partial refresh operation) is executed. For example, a signal that determines a refresh area is supplied from the control circuit 10 to the refresh address counter 17, and a signal that determines a refresh internal is supplied from the control circuit 10 to the refresh timer 18.

In the normal refresh operation, the refresh address counter 17 sequentially increments an internal row address signal (a refresh address signal) on the basis of a trigger signal supplied thereto from either outside or inside of the chip. Hence, all rows (word lines) of the memory cell array 11 are sequentially selected, as a result of which the data stored in all memory cells is refreshed.

In the low-current-consumption refresh operation according to the example of the present invention, part of the internal row address signal is fixed ("0" or "1"). Hence, the refresh operation is executed only for the memory cells of a predetermined refresh area.

Where 8,192 rows are selected on the basis of a 13-bit internal row address signal A0–A12, the refresh counter 17 sequentially increments the internal row address signal A0–A12 on the basis of a trigger signal supplied thereto from either outside or inside of the chip. If the value of the most significant bit A12 is fixed at "0", only the rows that have addresses whose most significant bit A12 is "0" are selected. In other words, the rows that have addresses whose most significant bit A12 is "1" are not selected.

Assuming that the pause time characteristic of the memory cells is constant, the same refresh interval tR can be used for both the normal refresh operation and the low-current-consumption refresh operation according to the present invention.

As described above, in the low-current-consumption refresh operation according to the example, part of an internal address signal is fixed so as to determine a limited refresh area. Since the number of rows (word lines) selected at the time of the refresh operation is reduced, the memory capacity "nrefresh" of the memory cell array subjected to the refresh operation decreases. In addition, the number N of times refresh operation is executed per unit time decreases.

Thanks to these features, the amount of current consumed for the refresh operation can be reduced.

It should be noted that the number of rows (word lines) selected is smaller in the low-current-consumption refresh operation than in the normal refresh operation. (The number of rows corresponds to the memory capacity "nrefresh.") Given that the internal row signal is incremented at the constant intervals, the refresh interval tR is shorter in the low-current-consumption refresh operation than in the normal refresh operation.

It should be noted, however, that the refresh interval tR can be maximized to a value that is determined by the pause time characteristic of the memory cells.

Therefore, when the low-current-consumption refresh mode is selected, the intervals at which the internal row address signal is incremented are lengthened by a control signal. To be specific, the intervals at which a trigger signal is generated are lengthened.

For example, where the most significant bit A12 is fixed, the memory capacity of the refresh area of the memory cell array is half that of the total memory capacity of the memory cell array (the number of rows selected is also half). Therefore, the intervals at which the internal row address signal is incremented are doubled (the intervals at which the trigger signal is generated are doubled).

Where the values of the n significant bits of the internal row address signal are fixed, the memory capacity of the refresh area is $\frac{1}{2^n}$ of the total memory capacity of the memory cell array. In this case, the intervals at which the internal row address signal is incremented are made $2^n$ times longer.

In the example described above, at least bit of the internal address signal (the refresh address signal) is fixed, and the intervals at which the trigger signal is generated are lengthened. Owing to this, the rows that are present in the predetermined refresh area are selected at maximal refresh intervals tR.

In other words, the intervals at which the internal row address is incremented (i.e., the intervals at which the trigger signal is generated) are varied in accordance with the memory capacity of the refresh area in such a manner that the refresh interval tR is the same between the normal refresh mode and the low-current-consumption refresh mode of the example of the present invention.

Alternatively, the memory capacity of the refresh area may be varied without changing the intervals at which the trigger signal is generated. In this case, the refresh intervals tR are varied in accordance with the memory capacity of the refresh area. It should be noted that when the entire memory cell array of a DRAM is refreshed, the refresh interval tR is maximal. This means that the refresh interval tR is not more than a value determined by the pause time characteristic of the memory cells.

As described above, the semiconductor memory of the aspect of the present invention enables both a reduction in the number N of times the refresh operation is executed per unit time and a decrease in the amount of current consumed for the refresh operation, without entailing a change in the pause time characteristic of the memory cells.

[First Embodiment]

The normal refresh operation and the low-current-consumption refresh operation according to the first embodiment of the present invention will now be described, referring to the logical address space diagram shown in FIGS. 2 and 3.

The DRAM of the first embodiment has a memory capacity of 64 mega bits and comprises 8 kilo rows and 8 kilo columns. The 8 kilo rows are unconditionally designated by a 13-bit internal address signal (a refresh address signal) A0–A12.

Figure 2:
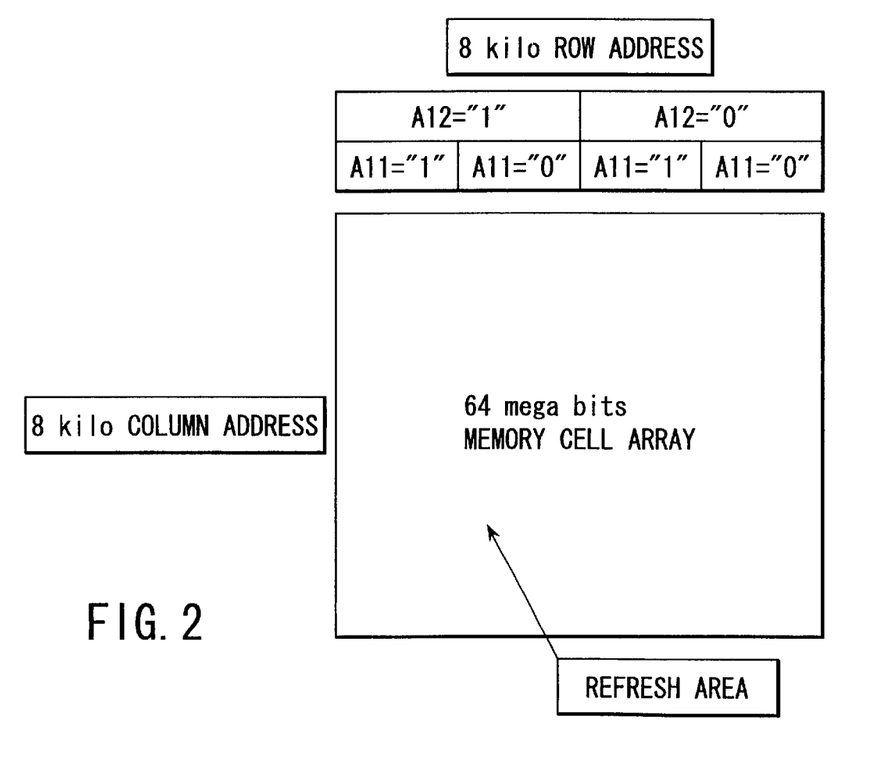
FIG. 2 shows a refresh area in a normal refresh mode.

As shown in FIG. 2, in the normal refresh operation, the 13-bit internal address signal A0–A12 is sequentially incremented. The manner in which the internal address signal A0–A12 is incremented (the manner in which the signal is changed determines a row [word line] selection order, the number of rows [word lines] selected at a time, etc.) can be arbitrarily determined. The only requisite for this determination is that all rows must be selected within the period corresponding to refresh interval tR.

Figure 3:
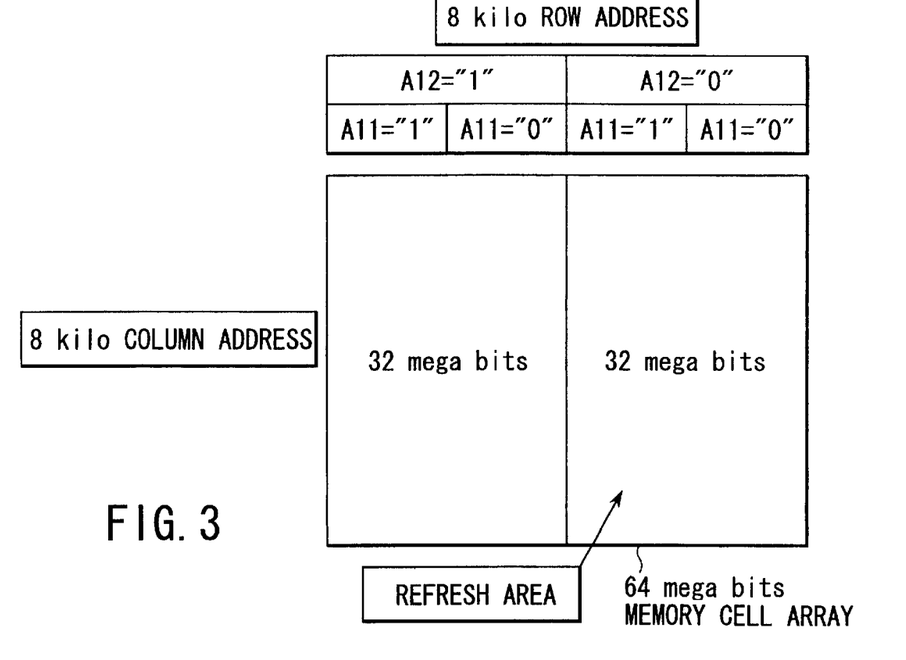
FIG. 3 is a refresh area in a refresh mode according to an example of the present invention.

As shown in FIG. 3, in the low-current-consumption refresh operation according to the first embodiment of the present invention, the 13-bit internal address signal A0–A12 is sequentially incremented, but the value of the most significant bit A12 is fixed at "0." In this case, the refresh operation is executed only for the memory cells that have addresses whose most significant bit A12 is "0." To be more specific, the refresh operation is executed for the memory cells that are present in the refresh area whose memory capacity is half that of the DRAM.

The low-current-consumption refresh operation according to the first embodiment of the present invention is similar to the normal refresh operation in two points, in that the manner in which the internal address signal A0–A12 (A12: a fixed value) is incremented can be arbitrarily determined. That is, a row (word line) selection order, the number of rows (word lines) selected at a time, etc. can be arbitrarily determined. The only requisite for the low-current-consumption refresh operation is that all rows must be selected within the period corresponding to refresh interval tR.

In the first embodiment of the present invention, two modes are selectively available based on a control signal. One of the two modes is the normal refresh mode described above, and the other is the low-current-consumption refresh mode also described above. The control signal may be a signal comprised of one bit so as to enable switching between the two modes.

The normal refresh mode is selected when the overall memory capacity of the memory cell array is used. On the other hand, the low-current-consumption refresh operation according to the first embodiment of the present invention is selected when data to be stored is small in amount and only one half of the memory cell array is used.

In the first embodiment, two modes are selectively available based on a control signal. Although this control signal is supplied from outside the chip, it may be automatically generated inside the chip in accordance with the amount of data. In addition, in the low-current-consumption refresh mode according to the first embodiment of the present invention, A12 may be selectively fixed at either "0" or "1." Furthermore, the control signal may be fixed in such a manner that it selects the low-current-consumption refresh mode at all times.

As described above, in the low-current-consumption refresh operation of the first embodiment, the number N of times the refresh operation is executed per unit time can be reduced to half in comparison with the normal refresh mode. As a result, the amount of current consume for the refresh operation can be reduced to half.

[Second Embodiment]

The normal refresh operation and the low-current-consumption refresh operation according to the second embodiment of the present invention will now be described, referring to the logical address space diagram shown in FIGS. 2 and 4.

Like the DRAM of this first embodiment, the DRAM of the second embodiment has a memory capacity of 64 mega bits and comprises 8 kilo rows and 8 kilo columns. The 8 kilo rows are unconditionally designated by a 13-bit internal address signal (a refresh address signal) A0–A12.

The normal refresh operation is executed in the same fashion as described above in connection with the first embodiment.

Figure 4:
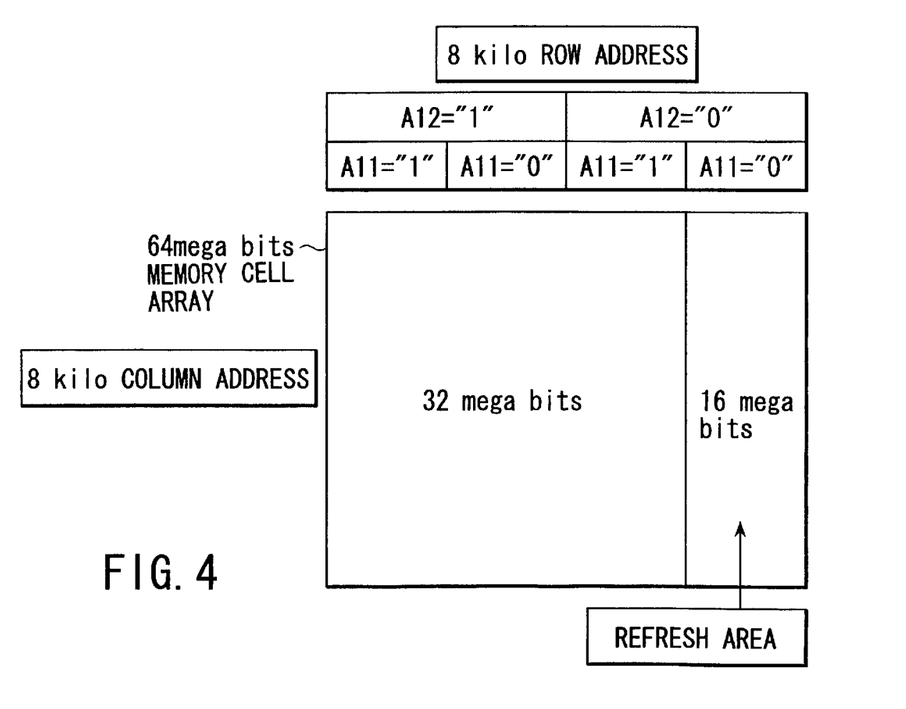
FIG. 4 is a refresh area in a refresh mode according to an example of the present invention.

As shown in FIG. 4, in the low-current-consumption refresh operation according to the second embodiment of the present invention, the 13-bit internal address signal A0–A12 is sequentially incremented, but the values of significant two bits A12 and A11 are fixed at "0." In this case, the refresh operation is executed only for the memory cells that have addresses whose most significant two bits A12 and A11 are "0." To be more specific, the refresh operation is executed for the memory cells that are present in the refresh area whose memory capacity is a quarter (16 Mbits) of that of the DRAM.

In the second embodiment as well, two modes are selectively available based on a control signal. One of them is the normal refresh mode described above, and the other is the low-current-consumption refresh mode also described above. The control signal may be a signal comprised of one bit so as to enable switching between the two modes.

The normal refresh mode is selected when the overall memory capacity of the memory cell array is used. On the other hand, the low-current-consumption refresh operation according to the second embodiment of the present invention is selected when data to be stored is small in amount and only one quarter of the memory cell array is used.

In the second embodiment, significant two bits A12 and A11 of the internal row signal (the refresh address signal) are fixed. However, the bits whose values are fixed may be determined in accordance with the memory capacity of the refresh area. In other words, at least one bit of the internal row address signal may be fixed. The fixed bit or bits are either "0" or "1" in accordance with the position of the refresh area.

As described above, in the low-current-consumption refresh operation of the second embodiment, the number N of times the refresh operation is executed per unit time can be reduced to a quarter in comparison with the normal refresh mode. As a result, the amount of current consume for the refresh operation can be reduced to a quarter.

[Third Embodiment]

According to the first and second embodiments described above, the refresh operation is executed in two modes: the normal refresh mode and the low-current-consumption refresh mode according to the example of the present invention. In the first and second embodiments, therefore, a signal comprised of at least one bit can be used as the control signal.

According to the present invention, a plurality of refresh areas can be determined in such a manner that the total memory capacity of them is smaller than the memory capacity of the DRAM. In the low-current-consumption refresh mode, one of the refresh areas can be selected in accordance with the data capacity.

The control signal for enabling this is comprised of a plurality of bits. Where the control signal is comprised of N bits, the maximal number of modes available is $2^n$ (one of which is the normal refresh mode, and the remaining ones are low-current-consumption refresh modes).

A refresh area can be very narrow in comparison with the memory capacity of the DRAM. In this case, the number of bits constituting a row address signal and fixed in value is increased.

An external input terminal used exclusively for the control signal may be provided. In this case, the control signal is supplied from this terminal. Alternatively, the control signal may be generated from a combination of existing external input signals by employing a mode register set or the like.

[Circuit Configuration]

A circuit configuration of the semiconductor memory according to an example of the present invention will be described.

Figure 5A:
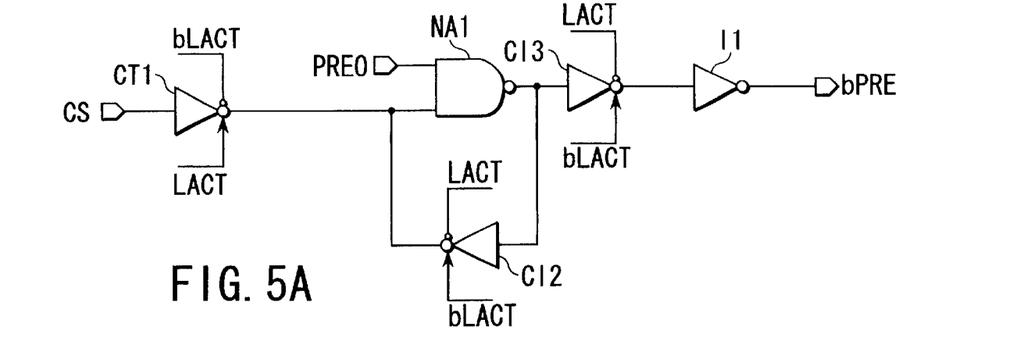
FIGS. 5A and 5B show a control circuit according to an example of the present invention.
Figure 5B:
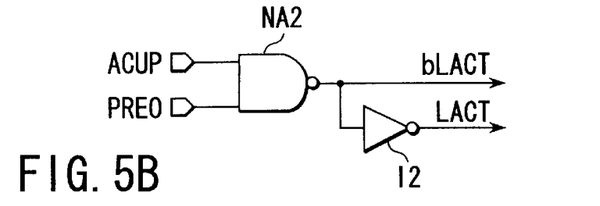
Figure 6:
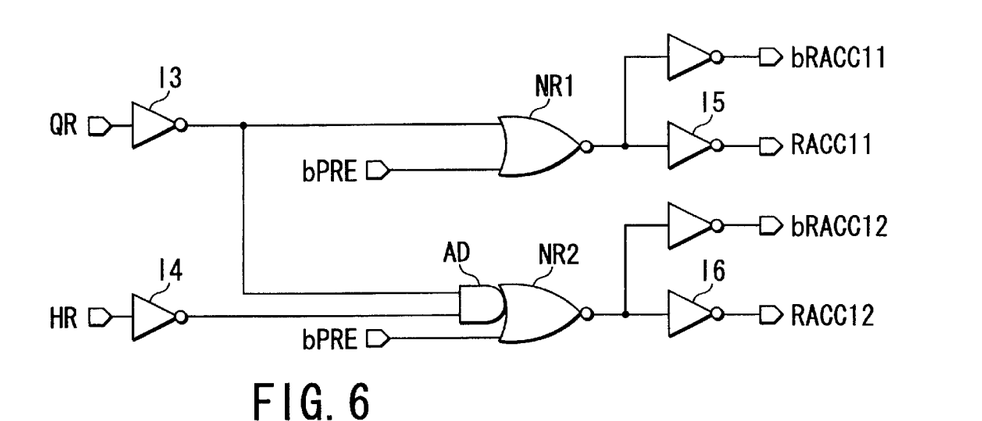
FIG. 6 also shows the control circuit according to an example of the present invention.
Figure 7:
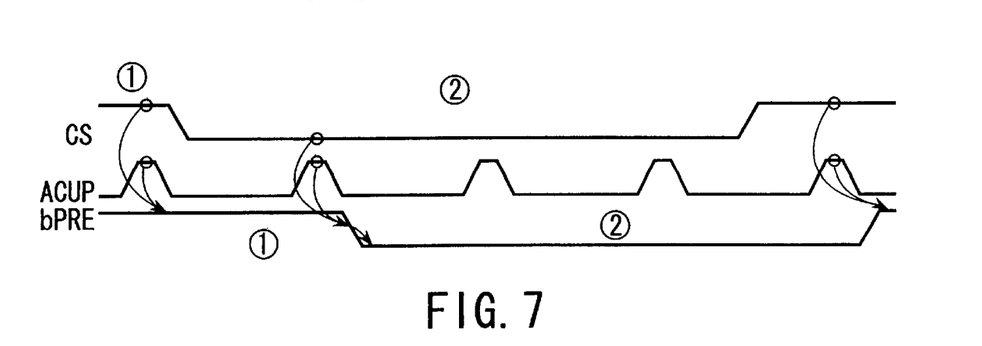
FIG. 7 is a waveform chart illustrating operations of the control circuits shown in FIGS. 5A, 5B and 6.

FIGS. 5A, 5B and 6 show a circuit configuration of the control circuit according to the example of the present invention. FIG. 7 is a waveform chart illustrating the operation of the circuit shown in FIGS. 5A, 5B and 6.

A clock signal CS passes through a clocked inverter CI1 and is supplied to the first input terminal of an NAND circuit NA1. To the second input terminal of this NAND circuit NA1, a control signal "PREO" (a Partial Refresh Enable Option Signal) is supplied.

The control signal "PREO" determines whether or not a chip should be provided with the function of switching between the normal refresh operation and the refresh operation according to the present invention in response to control signal CS.

For example, when the control signal "PREO" is at "L" level, only the normal refresh operation is executed without reference to control signal CS, and the refresh operation according to the present invention is not executed. When the control signal "PREO" is at "H" level, either the normal refresh operation or the refresh operation according to the present invention is executed on the basis of control signal CS.

The level ("H" or "L") of the control signal "PREO" is determined in accordance with the state of a fuse. More specifically, the level of the control signal "PREO" is determined by whether or not to disconnect the fuse in the manufacturing process of the chip. This means that the level of the control signal "PREO" is fixed at either "H" or "L" in the state of a commercial product.

It is possible to change the level of the control signal "PREO" in response to an electric signal, if so desired.

A clocked inverter CI2 is connected between the first input terminal of the NAND circuit NA1 and the output terminal thereof. An output signal from the NAND circuit NA1 passes through both a clocked inverter CI3 and an inverter I1, and the resultant signal is used as a control signal bPRE.

When a latch signal "LACH" becomes "H", the clocked inverters CI1, CI2 and CI3 are set in the active state. Thus, the control signal CS is latched by the latch section made up of the NAND circuit NA1 and the clocked inverter CI2. In addition, the control signal CS is used for generating a control signal bPRE.

Latch signals LACT and bLACT are generated on the basis of control signals ACUP and PREO. Control signal ACUP (which is an Address Count Up Pulse signal) is a pulse signal for counting up (or counting down) the count value of the refresh counter 17 (by which a refresh address signal is generated).

Control signal ACUP (a pulse signal) is output each time the refresh operation is executed for the memory cells corresponding to one row address.

In the state where control signal PREO is "H", latch signal "LACH" switches to "H" when control signal ACUP becomes "H", and to "L" when control signal ACUP becomes "L." In the state where control signal PREO is "L", latch signal "LACH" remains "L" without reference to the level of control signal ACUP.

Control signal bPRE (which is a Partial Refresh Enable signal) is not completely synchronized with control signal CS. As indicated in FIG. 7, the level of control signal bPRE is determined by the level at which control signal CS is when control signal ACUP is "H."

In this manner, the level of control signal bPRE (i.e., whether the normal refresh mode or the partial refresh mode) is determined by the level at which control signal CS is when control signal ACUP (a pulse signal) is "H." The reason for determining the level of control signal bPRE in this manner is to prevent the switching of control signal bPRE during the refresh operation.

Control signal bPRE is supplied to the first input terminals of NOR circuits NR1 and NR2. Control signal QR (Quarter Refresh) passes through an inverter I3 and is then supplied to the second input terminal of NOR circuit NR1. Also, control signal QR is supplied to an AND circuit AD. Control signal HR (Half Refresh) passes through an inverter I4 and is then supplied to the AND circuit AD. An output signal from the AND circuit AD is supplied to the second input terminal of NOR circuit NR2.

An output signal from NOR circuit NR1 is used as control signal bRACC11. The same output signal is made to pass through an inverter I5, and the resultant signal is used as control signal RACC11. Likewise, an output signal from NOR circuit NR2 is used as control signal bRACC12. The same output signal is made to pass through an inverter I6, and the resultant signal is used as control signal RACC12.

In the circuit configuration described above, the levels ("H" or "L") of control signals QR and HR are used for determining whether or not to fix the level of the most significant bit A12 of the 13-bit row address signal A12–A0, whether or not to fix the levels of significant bits A12 and A11 of the same address signal, or whether or not to leave all bits A12–A0 of the same signal in the unfixed state.

If control signal PREO is "H" and control signal CS is "L", then control signal bPRE is "L" (a partial refresh mode). In this case, if control signal HR is "H" and control signal QR is "L", then signal RACC12 is "L", signal RACC11 is "H", signal bRACC12 is "H", and signal bRACC11 is "L." As a result, the level of the most significant bit A12 of the 13-bit row address signal A12–A0 is fixed (the half refresh mode). This will be described in more detail later.

If control signals HR and QR are "H" in the state where control signal bPRE is "L", then signals RACC12 and RACC11 are both "L", and signals bRACC12 and bRACC11 are both "L." As a result, two significant bits A12 and A11 of the 13-bit row address signal A12–A0 are fixed in level (quarter refresh mode). This will be described in more detail later.

If control signals HR and QR are "L" in the state where control signal bPRE is "L", then signals RACC12 and RACC11 are both "H", and signals bRACC12 and bRACC11 are both "L." In this case, the levels of all bits of the 13-bit row address signal A12–A0 are not fixed.

Therefore, the levels of control signals HR and QR are controlled to be either ① control signal HR="H", control signal QR="L" or ② control signal HR="H", control signal QR="H".

The levels of control signals HR and QR ("H" or "L") are determined in accordance with the state of the fuse. In other words, the levels of control signals HR and QR are determined by disconnecting or not disconnecting the fuse when the chip is manufactured.

It is possible to change the levels of control signals in response to an electric signal, if so desired.

When control signal PREO is "L" or control signal CS is "H", control signal bPRE is "H." In this case, signals RACC12 and RACC11 are "H" and signals bRACC12 and bRACC11 are "L" without reference to the levels of control signals HR and QR. This means that all bits A12–A0 of the 13-bit row address signal A12–A0 are not fixed in level.

Figure 8:
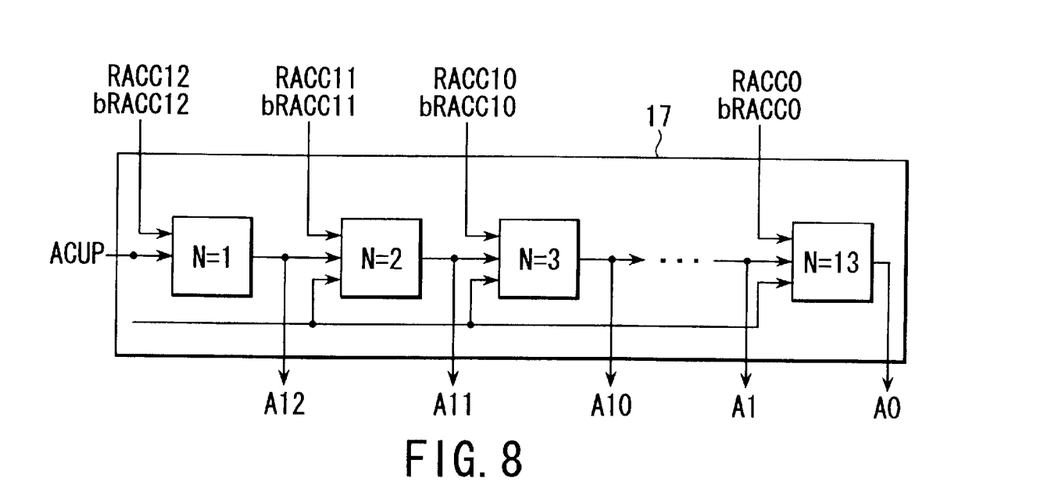
FIG. 8 shows a circuit configuration of a refresh address counter according to an example of the present invention.

FIG. 8 shows an example of a circuit configuration of the refresh address counter depicted in FIG. 1.

The circuit configuration shown in FIG. 8 is adapted for use in the first to third embodiments described above. Therefore, the refresh address signal A12–A0 generated by the refresh address counter 17 is comprised of 13 bits. The number of bits constituting the refresh address signal A12–A0 corresponds to the number of units included in the refresh address counter 17. In the circuit configuration shown in FIG. 8, therefore, the number of units included in the refresh address counter 17 is 13 (N=1, 2, 3, . . . 13).

The requisite for the circuit configuration shown in FIG. 8 is required to meet the following two cases: ① one memory array is divided into four refresh areas, and the refresh mode for refreshing the memory cells of only one refresh area (the quarter refresh mode) and the refresh mode for refreshing the memory cells of all refresh areas are switched from one to the other in response to control signal CS (the normal refresh mode); and ② one memory array is divided into two refresh areas, and the refresh mode for refreshing the memory cells of only one refresh area (the half refresh mode) and the refresh mode for refreshing the memory cells of the two refresh areas are switched from one to the other in response to control signal CS (the normal refresh mode).

To satisfy this requirement, the units (N=1, 2) for generating significant bits A12 and A11 of the refresh address signal A12–A0 are supplied with control signals RACC12, bRACC12, RACC11 and bRACC11 generated by the circuit shown in FIGS. 5 and 6. In this manner, the level of the significant bits A12 and A11 are fixed.

Figure 9:
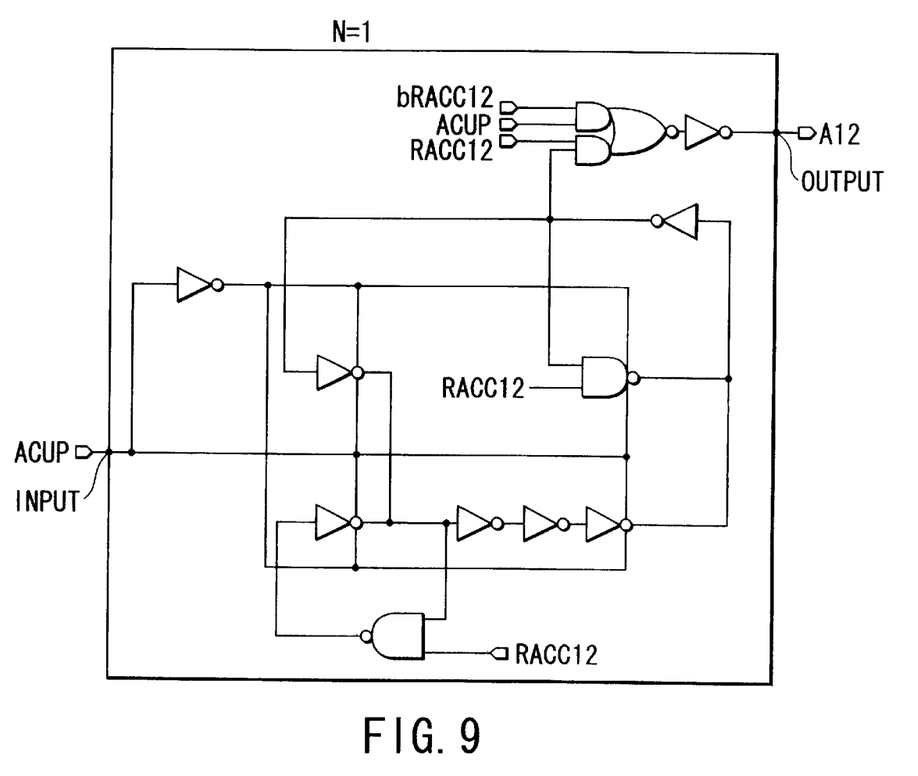
FIG. 9 shows an example of a circuit configuration of the first-stage unit of the counter depicted in FIG. 8.

FIG. 9 shows an example of a circuit configuration of the first-stage unit N=1 of the counter depicted in FIG. 8.

The first-stage unit N=1 receives a control signal ACUP (an Address Count Up Pulse signal) and outputs a refresh address signal A12. In the case where signal RACC12 is "H" and signal bRACC12 is "L", the refresh address signal A12 is a binary count output signal synchronizing the control signal ACUP as a base clock. In the case where signal RACC12 is "L" and signal bRACC12 is "H", the refresh address signal A12 is the control signal ACUP.

The control signal ACUP as a pulse signal is generated whenever the refresh operation is finished. The level of the control signal always returns "L" before the refresh operation is finish. Therefore, the refresh address signal A12 is the control signal ACUP setting "L" and inputs to the address driver. As a result, the refresh address signal A12 is fixed at "L" in the row decoder circuit.

Figure 10:
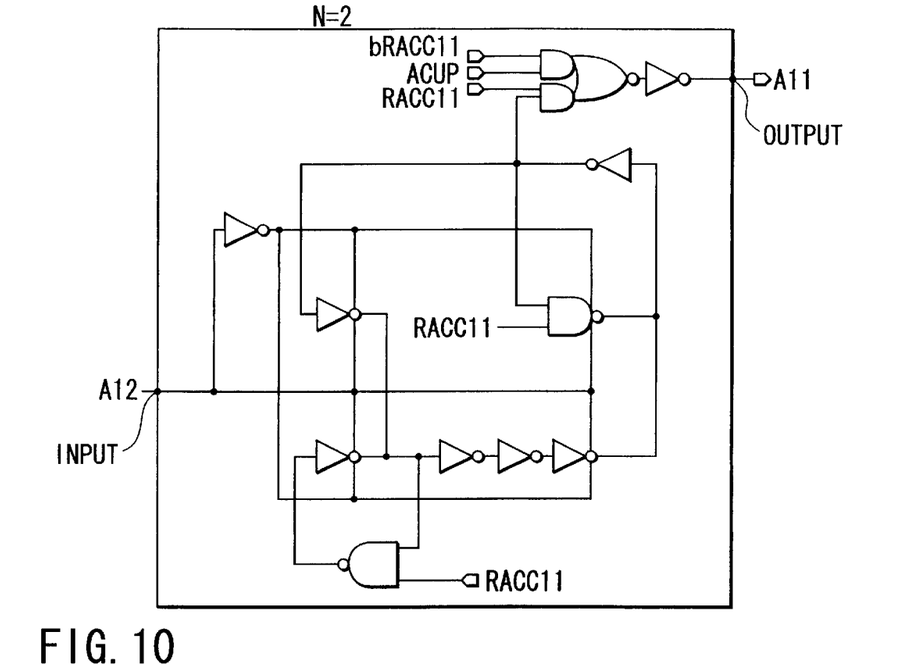
FIG. 10 shows an example of a circuit configuration of the second-stage unit of the counter depicted in FIG. 8.

FIG. 10 shows an example of a circuit configuration of the second-stage unit N=2 of the counter depicted in FIG. 8.

An output signal A12 from the first-stage unit N=1 is supplied to the second-stage unit N=2. One of the control signal ACUP and the binary count output signal as a base clock synchronizing the control signal ACUP is selectively input to the second-stage unit N=2 based on the control signals RACC12,bRACC12.

The second-stage unit N=2 receives the output signal A12 and outputs a refresh address signal A11. In the case where signal RACC11 is "H" and signal bRACC11 is "L", the refresh address signal A11 is a binary count output signal synchronizing the refresh address signal A12 as a base clock. In the case where signal RACC11 is "L" and signal bPACC11 is "H", the refresh address signal A11 is the control signal ACUP.

The control signal ACUP as a pulse signal is generated whenever the refresh operation is finished. The level of the control signal always returns "L" before the refresh operation is finish. Therefore, the refresh address signal A11 is the control signal ACUP setting "L" and inputs to the address driver. As a result, the refresh address signal A11 is fixed at "L" in the row decoder circuit.

Figure 11:
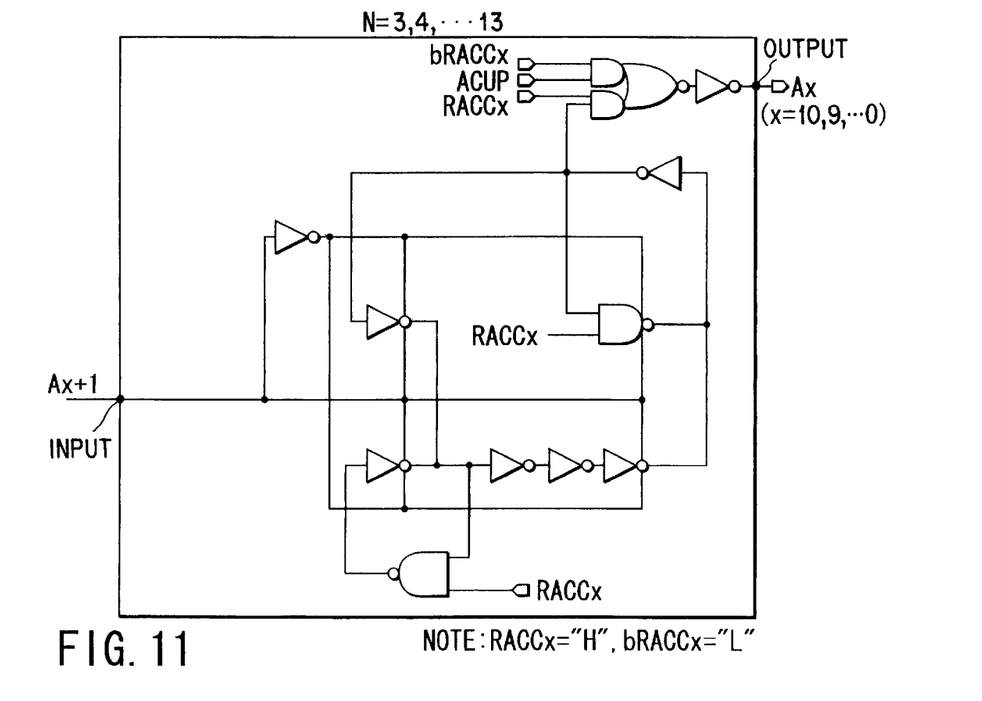
FIG. 11 shows an example of a circuit configuration of the third- or subsequent-stage unit of the counter depicted in FIG. 8.

FIG. 11 shows an example of a circuit configuration of the third- or subsequent-stage unit N=3, 4, . . . 13 of the counter depicted in FIG. 8.

Each of the units N=3, 4, . . . 13 receives the output signal Ax+1 of the forward unit. And each of the units N=3, 4, . . . 13 outputs the output signal Ax to the backward unit.

In the units N=3, 4, . . . 13, the control signal RACCx is fixed "H", and the control signal bRACCx is fixed "L", the refresh address signal Ax is always equal to a signal binary counting the input signal Ax+1.

An example of a circuit configuration of the refresh address counter has been described with reference to FIGS. 8–11. It should be noted that the units of the refresh address counter may be the same or different in circuit configuration.

Figure 12:
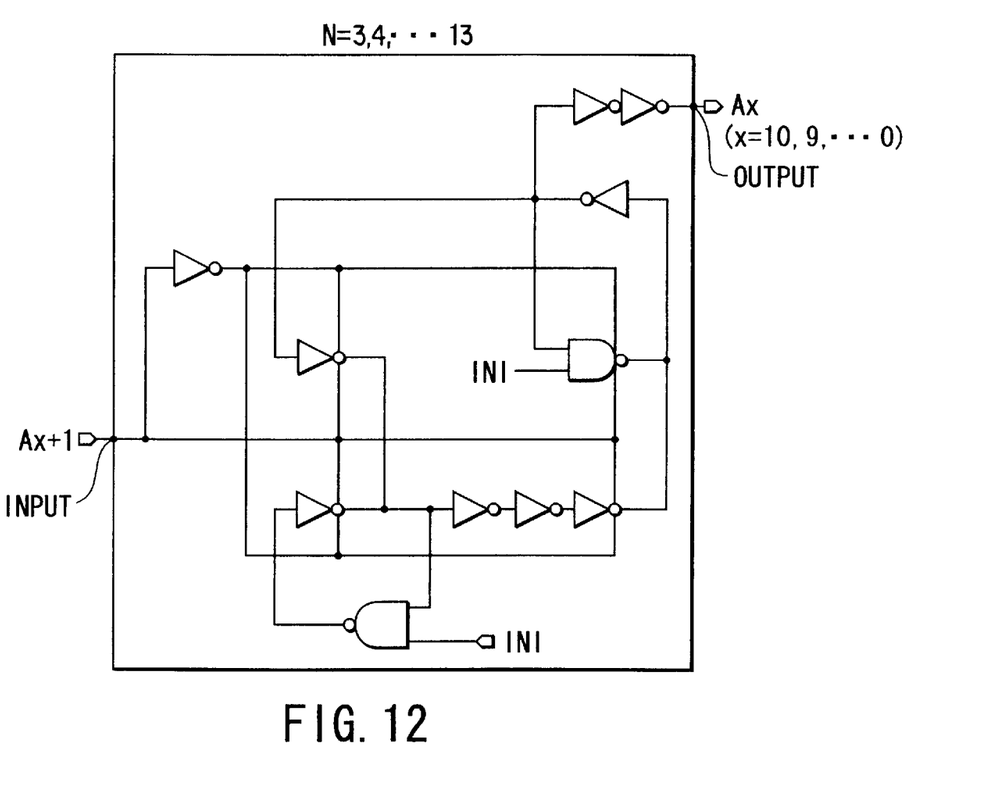
FIG. 12 shows another example of a circuit configuration of the third- or subsequent-stage unit of the counter depicted in FIG. 8.

For example, in the case of the unit N=3, 4, . . . 13 shown in FIG. 11, the logic circuit at the output section can be simplified. That is, as shown in FIG. 12.

In the above circuit configuration of the example, two significant bits A12 and A11 of 13-bit row address signal A12–A0 can be fixed. This structure is to put at least the first to third embodiments to practical use. Needless to say, the circuit configuration can be easily modified in such a manner as to fix three or more significant bits of a row address signal.

[Operation]

A description will now be given as to how a semiconductor memory according to the first and second embodiment operates in the case where the circuit configuration shown in FIGS. 5A, 5B, 6–12 is used.

① Case of First Embodiment i. Prerequisite

To provide a chip with a function according to the present invention, control signal PREO is set at "H". In the first embodiment, since the 64-Mbit memory cell array is divided into two 32-Mbit memory cell array areas, control signal HR is set at "H", and control signal QR is set at "L." In addition, signals RACC10-RACC0 are set at "H", and signals bRACC10-bRACC0 are set at "L."

Under this prerequisite condition, the normal refresh operation and the half refresh operation according to the present invention are selectively executed on the basis of the level of control signal CS.

ii. Normal Refresh Operation

When the normal refresh operation is executed, i.e., when the memory cells of the 64-Mbit memory cell array are refreshed, control signal CS is set at "H." In the case where control signal CS is "H", control signal bPRE becomes "H" when control signal ACUP becomes "H." When control signal bPRE is "H", signals RACC12, bRACC12, RACC11 and bRACC11 become "H", "L", "H" and "L", respectively, as shown in Table 1.

TABLE 1

| | A12 | A11 | A10 | A9 | A8 | A7 | A6 | A5 | A4 | A3 | A2 | A1 | A0 |
|---|---|---|---|---|---|---|---|---|---|---|---|---|---|
| Normal Refresh | N = 1 | 2 | 3 | 4 | 5 | 6 | 7 | 8 | 9 | 10 | 11 | 12 | 13 |
| Input | ACUP | A12 | A11 | A10 | A9 | A8 | A7 | A6 | A5 | A4 | A3 | A2 | A1 |
| Output | A12 | A11 | A10 | A9 | A8 | A7 | A6 | A5 | A4 | A3 | A2 | A1 | A0 |
| RACCx/bRACCx | H/L | H/L | H/L | H/L | H/L | H/L | H/L | H/L | H/L | H/L | H/L | H/L | H/L |

As shown, signals RACCx (x: 12, 11, . . . 0) are "H" and signals bRACCx are "L" in each of the units of the refresh address counter.

Therefore, the first-stage unit N=1 is supplied with a pulse signal ACUP, and each of the second and subsequent units is supplied with an output signal from the immediately preceding unit. As a result, 13-bit refresh row address signal A12–A0 is sequentially incremented in synchronism with the pulse signal ACUP.

iii. Half Refresh Operation

When the refresh operation according to the present invention is executed, i.e., when the memory cells of a 32-Mbit memory cell array, which is a half of the 64-Mbit memory cell array, are refreshed, control signal CS is set at "L." In the case where control signal CS is "L", control signal bPRE becomes "L" when control signal ACUP becomes "H." When control signal bPRE is "L", signals RACC12, bRACC12, RACC11 and bRACC11 become "L", "H", "H" and "L", respectively, as shown in Table 2.

TABLE 2

| Half Refresh | A12 N = 1 | A11 2 | A10 3 | A9 4 | A8 5 | A7 6 | A6 7 | A5 8 | A4 9 | A3 10 | A2 11 | A1 12 | A0 13 |
|---|---|---|---|---|---|---|---|---|---|---|---|---|---|
| Input | ACUP | ACUP | A11 | A10 | A9 | A8 | A7 | A6 | A5 | A4 | A3 | A2 | A1 |
| Output | ACUP | A11 | A10 | A9 | A8 | A7 | A6 | A5 | A4 | A3 | A2 | A1 | A0 |
| RACCx/bRACCx | L/H | H/L | H/L | H/L | H/L | H/L | H/L | H/L | H/L | H/L | H/L | H/L | H/L |

As shown, signal RACC12 is "L" and signal bRACC12 is "H" in the first-stage unit (N=1) of the refresh address counter. In each of the second-stage and subsequent units (N=2, 3, . . . 13), signals RACCx (x: 11, 10, . . . 0) are "H", and signals bRACCx are "L."

Therefore, the output signal A12 (a row address signal) of the first-stage unit N=1 is the control signal ACUP. The control signal ACUP as a pulse signal is generated whenever the refresh operation is finished. The level of the control signal always returns "L" before the refresh operation is finish. Therefore, the refresh address signal A12 is the control signal ACUP setting "L" and inputs to the address driver. As a result, the refresh address signal A12 is fixed at "L" in the row decoder circuit.

The output signal A12 of the first-stage unit N=1 substantially equal to the control signal ACUP and inputs to the second-stage unit N=2. As a result, the refresh address signals A11–A0 except to the most significant bit A12 are sequentially incremented in synchronism with the pulse signal ACUP.

(2) Case of Second Embodiment i. Prerequisite

To provide a chip with a function according to the present invention, control signal PREO is set at "H." In the second embodiment, since the 64-Mbit memory cell array is divided into four 16-Mbit memory cell array areas, control signal HR is set at "H", and control signal QR is set at "H." In addition, signals RACC10-RACC0 are set at "H", and signals bRACC10-bRACC0 are set at "L."

Under this prerequisite condition, the normal refresh operation and the quarter refresh operation according to the present invention are selectively executed on the basis of the level of control signal CS.

ii. Normal Refresh Operation

When the normal refresh operation is executed, i.e., when the memory cells of the 64-Mbit memory cell array are refreshed, control signal CS is set at "H." In the case where control signal CS is "H", control signal bPRE becomes "H" when control signal ACUP becomes "H." When control signal bPRE is "H", signals RACC12, bRACC12, RACC11 and bRACC11 become "H", "L", "H" and "L", respectively, as shown in Table 1.

As shown, signals RACCx (x: 12, 11, . . . 0) are "H" and signals bRACCx are "L" in each of the units of the refresh address counter.

Therefore, the first-stage unit (N=1) is supplied with a pulse signal ACUP, and each of the second and subsequent units (N=2, 3, . . . 13) is supplied with an output signal from the immediately preceding unit. As a result, a 13-bit refresh row address signal A12–A0 is sequentially incremented in synchronism with the pulse signal ACUP.

iii. Quarter Refresh Operation

When the refresh operation according to the present invention is executed, i.e., when the memory cells of a 16-Mbit memory cell array, which is a quarter of the 64-Mbit memory cell array, are refreshed, control signal CS is set at "L." In the case where control signal CS is "L", control signal bPRE becomes "L" when control signal ACUP becomes "H." When control signal bPRE is "L", signals RACC12, bRACC12, RACC11 and bRACC11 become "L", "H", "L" and "H", respectively, as shown in Table 3.

TABLE 3

| Quarter Refresh | A12 N = 1 | A11 2 | A10 3 | A9 4 | A8 5 | A7 6 | A6 7 | A5 8 | A4 9 | A3 10 | A2 11 | A1 12 | A0 13 |
|---|---|---|---|---|---|---|---|---|---|---|---|---|---|
| Input | ACUP | ACUP | ACUP | A10 | A9 | A8 | A7 | A6 | A5 | A4 | A3 | A2 | A1 |
| Output | ACUP | ACUP | A10 | A9 | A8 | A7 | A6 | A5 | A4 | A3 | A2 | A1 | A0 |
| RACCx/bRACCx | L/H | L/H | H/L | H/L | H/L | H/L | H/L | H/L | H/L | H/L | H/L | H/L | H/L |

As shown, signal RACC12 is "L" and signal bRACC12 is "H" in the first-stage unit (N=1) of the refresh address counter. In the second-stage unit (N=2), signal RACC11 is "L" and signal bRACC11 is "H." In each of the third-stage and subsequent units (N=3, 4, . . . 13), signals RACCx (x: 10, 11, . . . 0) are "H", and signals bRACCx are "L."

Therefore, the output signals A12, A11 (row address signal) of the first-stage unit N=1 and the second-stage unit N=2 are the control signal ACUP. The control signal ACUP as a pulse signal is generated whenever the refresh operation is finished. The level of the control signal always returns "L" before the refresh operation is finish. Therefore, the refresh address signals A12, A11 are the control signal ACUP setting "L" and input to the address driver. As a result, the refresh address signals A12, A11 are fixed at "L" in the row decoder circuit.

The output signal A11 of the second-stage unit N=2 substantially equal to the control signal ACUP and inputs to the third-stage unit N=3. As a result, the refresh address signals A10–A0 except to the upper bits A12, A11 are sequentially incremented in synchronism with the pulse signal ACUP.

[Example of System]

Figure 13:
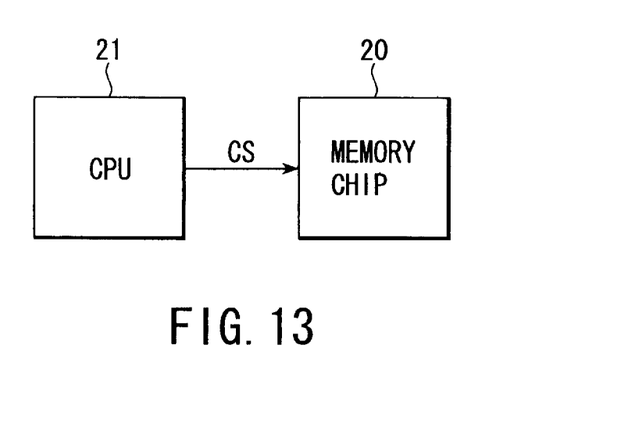
FIG. 13 shows a system employing a memory chip that is provided with a refresh function according to an example of the present invention.

FIG. 13 shows a system employing a memory chip that is provided with a refresh function according to an example of the present invention.

Referring to FIG. 15, a memory chip 20 contains the circuit shown in FIG. 1. In the present example, the CPU 21 generates a control signal CS, which is supplied to a memory chip 20.

[Others]

The present invention is applicable to a system which, in a normal mode, requires a large memory capacity that enables storage of a large amount of data and which, in a special mode, stores a small amount of data with low power consumption (a small memory capacity is sufficient in the special mode). The present invention is particularly advantageous when it is applied to devices wherein power consumption control is important, as in portable electronic devices such as a cellular phone.

A semiconductor memory according to one example of the present invention has a mode in which a refresh operation is executed for a refresh area whose memory capacity is smaller than that of a memory cell array. Provided with such a mode, the semiconductor memory can reduce the number of times a refresh operation is executed per unit time and the amount of current required for the refresh operation, with no need to vary the pause time characteristics of the memory cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
    a memory cell array;
    a signal generation circuit configured to generate an internal address signal of plural bits used for selecting rows of the memory cell array when a refresh operation is executed; and
    a control circuit configured to fix a value of at least one of the bits of the internal address signal based on a first control signal and to select the rows in a refresh area of the memory cell array when the refresh operation is executed, memory capacity of the refresh area being smaller than that of the memory cell array.

2. The semiconductor memory according to claim 1, wherein values of n significant bits of the internal address signal are fixed when the refresh area has a memory capacity which is $\frac{1}{2^n}$ of the memory capacity of the memory cell array.

3. The semiconductor memory according to claim 1, wherein intervals at which the rows in the refresh area are selected are made $2^n$ times longer, when the refresh area has a memory capacity which is $\frac{1}{2^n}$ of the memory capacity of the memory cell array.

4. The semiconductor memory according to claim 1, wherein said refresh area is predetermined based on data stored in a memory element of a chip.

5. The semiconductor memory according to claim 1, wherein a function of selecting only the rows in the refresh area is made effective in response to a second control signal.

6. The semiconductor memory according to claim 1, wherein one of two modes is selected when the refresh operation is executed, said two modes including a mode in which all rows of the memory cell array are selected based on the first control signal, and a mode in which only the rows in the refresh area are selected.

7. The semiconductor memory according to claim 1, wherein said first control signal is generated outside of a chip.

8. The semiconductor memory according to claim 1, wherein said first control signal is generated inside of a chip.

9. The semiconductor memory according to claim 1, wherein said semiconductor memory is used in a portable electronic device.

10. The semiconductor memory according to claim 1, which is a dynamic random access memory.

11. A semiconductor memory device comprising:
    a memory cell array;
    a signal generation circuit configured to generate an internal address signal of plural bits used for selecting rows of the memory cell array when a refresh operation is executed;
    a control circuit configured to select the rows is a refresh area of the memory cell array when the refresh operation is executed, memory capacity of the refresh area being smaller than that of the memory cell array; and
    a refresh timer configured to determine timings for sequentially selecting the rows of the memory cell array one by one,
    wherein one of at least two refresh modes is selected when the refresh operation is executed, said at least two refresh modes including a first refresh mode in which all the rows of the memory cell array are selected based on a first control signal, and a second refresh mode in which only the rows In the refresh area are selected,
    the refresh timer changes the timings in accordance with the selected mode.

12. The semiconductor memory according to claim 11, wherein values of n significant bits of the internal address signal are fixed when the refresh area has a memory capacity which is $\frac{1}{2^n}$ of the memory capacity of the memory cell array.

13. The semiconductor memory according to claim 11, wherein intervals at which the rows in the refresh area are selected are made $2^n$ times longer, when the refresh area has a memory capacity which is $\frac{1}{2^n}$ of the memory capacity of the memory cell array.

14. The semiconductor memory according to claim 11, wherein said refresh area is predetermined based on data stored in a memory element of a chip.

15. The semiconductor memory according to claim 11, wherein a function of selecting only the rows in the refresh area is made effective in response to a second control signal.

16. The semiconductor memory according to claim 11, wherein said first control signal is generated outside of a chip.

17. The semiconductor memory according to claim 11, wherein said first control signal is generated inside of a chip.

18. The semiconductor memory according to claim 11, wherein said semiconductor memory is used in a portable electronic device.

19. The semiconductor memory according to claim 11, which is a dynamic random access memory.

20. A semiconductor memory comprising:
    a memory cell array;
    a signal generation circuit configured to generate an internal address signal of plural bits used for selecting rows of the memory cell array when a refresh operation is executed;
    a control circuit configured to fix a value of at least one of the bits of the internal address signal based on a first control signal and to select the rows in a refresh area of the memory cell array when the refresh operation is executed, memory capacity of the refresh area being smaller than that of the memory cell array; and
    a refresh timer configured to determine timings for sequentially selecting the rows of the memory cell array one by one, wherein one of at least two refresh modes is selected when the refresh operation is executed, said at least two refresh modes including a first refresh mode in which all the rows of the memory cell array are selected based on a first control signal, and a second refresh mode in which only the rows in the refresh area are selected, the refresh timer changes the timings in accordance with the selected mode.

21. The semiconductor memory according to claim 20, wherein values of n significant bits of the internal address signal are fixed when the refresh area has a memory capacity which is $\frac{1}{2^n}$ of the memory capacity of the memory cell array.

22. The semiconductor memory according to claim 20, wherein intervals at which the rows in the refresh area are selected are made $2^n$ times longer, when the refresh area has a memory capacity which is $\frac{1}{2^n}$ of the memory capacity of the memory cell array.

23. The semiconductor memory according to claim 20, wherein said refresh area is predetermined based on data stored in a memory element of a chip.

24. The semiconductor memory according to claim 20, wherein a function of selecting only the rows in the refresh area is made effective in response to a second control signal.

25. The semiconductor memory according to claim 20, wherein said first control signal is generated outside of a chip.

26. The semiconductor memory according to claim 20, wherein said first control signal is generated inside of a chip.

27. The semiconductor memory according to claim 20, wherein said semiconductor memory is used in a portable electronic device.

28. The semiconductor memory according to claim 20, which is a dynamic random access memory.

\* \* \* \* \*